(12) United States Patent
Xu et al.

(10) Patent No.: US 9,627,095 B1
(45) Date of Patent: Apr. 18, 2017

(54) MEMORY MODULE, MEMORY SYSTEM INCLUDING THE SAME AND OPERATION METHOD THEREOF

(71) Applicant: SK hynix Inc., Gyeonggi-do (KR)

(72) Inventors: Jing-Zhe Xu, Gyeonggi-do (KR); Yong-Ju Kim, Gyeonggi-do (KR); Jung-Hyun Kwon, Gyeonggi-do (KR); Sung-Eun Lee, Gyeonggi-do (KR); Jae-Sun Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/230,122

(22) Filed: Aug. 5, 2016

(30) Foreign Application Priority Data

Mar. 17, 2016 (KR) .................. 10-2016-0032358

(51) Int. Cl.
| | | |
|---|---|---|
| *G11C 29/00* | (2006.01) | |
| *G11C 11/4074* | (2006.01) | |
| *G11C 11/4076* | (2006.01) | |
| *G11C 11/4093* | (2006.01) | |
| *G11C 11/408* | (2006.01) | |
| *G11C 11/4094* | (2006.01) | |
| *G11C 17/16* | (2006.01) | |

(52) U.S. Cl.
CPC .......... *G11C 29/76* (2013.01); *G11C 11/4074* (2013.01); *G11C 11/4076* (2013.01); *G11C 11/4087* (2013.01); *G11C 11/4093* (2013.01); *G11C 11/4094* (2013.01); *G11C 17/16* (2013.01); *G11C 29/78* (2013.01)

(58) Field of Classification Search
CPC ..... G11C 29/76; G11C 29/78; G11C 11/4074; G11C 11/4076; G11C 11/4087; G11C 11/4094; G11C 17/16
USPC ......... 365/200, 185.02, 185.09, 185.11, 201, 365/225.7, 230.03; 714/1, 6.32, 723
See application file for complete search history.

(56) References Cited

U.S. PATENT DOCUMENTS

| | | | | |
|---|---|---|---|---|
| 4,426,688 A | * | 1/1984 | Moxley | G11C 29/76 365/200 |
| 5,848,009 A | * | 12/1998 | Lee | G11C 29/765 365/200 |
| 7,460,419 B2 | * | 12/2008 | Mori | G11C 29/76 365/185.09 |

FOREIGN PATENT DOCUMENTS

KR  1020140067879  6/2014

* cited by examiner

*Primary Examiner* — Tan T. Nguyen
(74) *Attorney, Agent, or Firm* — IP & T Group LLP

(57) ABSTRACT

A memory system may include a memory module comprising a plurality of memory chips mounted therein each memory chip comprising a plurality of banks, the memory chips being simultaneously accessible based on the same command and address; and a memory controller suitable for mapping the banks of the memory chips to each other while rearranging an order of the banks of each of the memory chips based on repair information of the memory chips.

20 Claims, 10 Drawing Sheets

MEMORY MODULE, MEMORY SYSTEM INCLUDING THE SAME AND OPERATION METHOD THEREOF

CROSS-REFERENCE TO RELATED APPLICATIONS

The present application claims priority under 35 U.S.C. §119(a) to Korean Patent Application No. 10-2016-0032358, filed on Mar. 17, 2016, the disclosure of which is incorporated herein by reference in its entirety.

BACKGROUND

1. Field

This patent document relates to a semiconductor design technology and, more particularly, to a dual in-line memory module (DIMM) capable of performing a repair operation.

2. Description of the Related Art

Semiconductor memory devices are fabricated in the form required by a system to which they are applied, in order to realize their large capacity and high performance. For example, for a system such as a personal computer (PC), a plurality of memory devices are integrated on one printed circuit board (PCB), and provided in the form of a module. The module is mounted in the system through slots.

Among modules of semiconductor memory devices, one of the most common modules is a dual in-line memory module (DIMM).

The DIMM may include a plurality of dynamic random access memory (DRAM) chips and registers mounted therein. When a defect occurs in any one of a large number of micro-cells forming a DRAM chip, the DRAM chip may not properly perform its function. In this case, a redundancy method may be employed, which replaces a defective cell with a redundant memory cell installed in the DRAM chip, thereby increasing the yield. According to the redundancy method, when memory cells are checked as defective cells, they are replaced with prepared redundancy cells on a row/column basis. Thus, the DRAM chip may not be discarded but continued to be used.

However, in the case of a DIMM including a plurality of DRAM chips, one or more DRAM chips are to be driven according to the same command and address. That is, banks within the DRAM chips may be mapped to each other, and rows or columns of cells of the mapped banks may be accessed according to the same command and address. When defective cells included in the respective DRAM chips are positioned at different rows or columns, the DRAM chips which are driven according to the same command and address cannot use all the rows or columns even though the rows or columns correspond to defective cells of the other chips. Thus, the yield of the entire DIMM is degraded.

Thus, a scheme for a more efficient repair operation of a DIMM is needed.

SUMMARY

Various embodiments are directed to a memory module which includes a plurality of memory chips operating based on the same command and address and rearranges the order of banks of each of the memory chips based on repair information of the memory chip, a memory system including the same and an operation method thereof.

In an embodiment, a memory system may include: a memory module comprising a plurality of memory chips mounted therein each memory chip comprising a plurality of banks, the memory chips being simultaneously accessible based on the same command and address; and a memory controller suitable for mapping the banks of the memory chips to each other while rearranging an order of the banks of each of the memory chips based on repair information of the memory chips.

In an embodiment, there is provided a memory module including a plurality of memory chips suitable for being simultaneously accessed based on the same command and address and each comprising a plurality of banks mapped to respective banks of the other memory chips, wherein each of the memory chips comprises: a memory array region having the plurality of banks arranged therein, the plurality of banks each including normal cells and redundancy cells for replacing repair target cells among the normal cells; a repair storage unit suitable for storing repair addresses of the repair target cells, and outputting the repair addresses as repair information; a repair control unit suitable for comparing the repair information and a row address, and generating a repair control signal for selectively enabling redundant paths between the repair target cells and the redundancy cells; a bank control unit suitable for generating a plurality of bank select signals by decoding a bank address, generating a plurality of bank enable signals based on the bank select signals, and rearranging the order of the bank select signals in response to a mapping signal; a row circuit suitable for enabling a word line corresponding to the row address based on the bank select signals and the repair control signal; and a column circuit suitable for accessing data of a bit line selected by the bank enable signals and a column address during a read or write operation.

In an embodiment, there is provided an operation method of a memory system which includes a memory controller and a memory module having a plurality of memory chips each including a plurality of banks. The operation method may include: storing, by the memory chips, a row or column address of memory cells as repair information, the memory cells being determined to be weak cells or defective cells; generating, by the memory controller, a mapping signal based on the repair information stored in the memory chips of the memory module during an initialization period; rearranging, by the memory chips, the order of the banks based on the mapping signal; and simultaneously accessing the respective banks of the memory chips in the rearranged order based on the same command and address after the initialization period.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
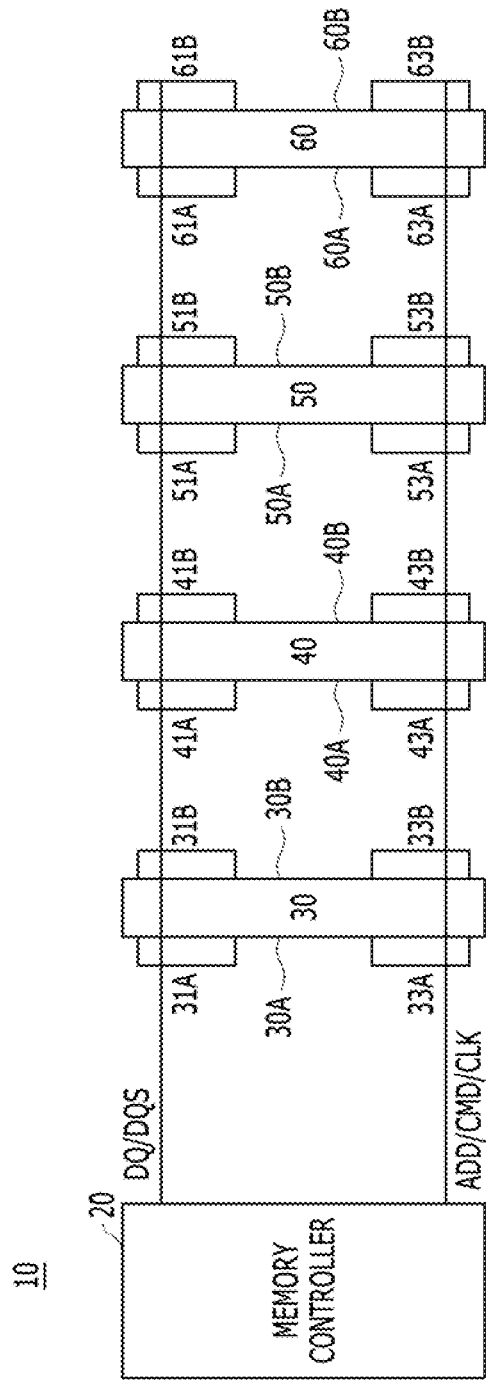
FIG. 1 is a block diagram illustrating a configuration of a memory system including a memory controller and a dual in-line memory module (DIMM).

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of present disclosure and the relevant art and will not be interpreted in an idealized or overly formal sense unless expressly so defined herein.

The present invention may have diverse modifications and embodiments. Also, the constituent elements of the embodiments of the present invention should be understood to not limited to the described elements only but also to include all modifications, substitutes and equivalents that are within the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

In some instances, as would be apparent to one of ordinary skill in the art, elements described in connection with a particular embodiment may be used singly or in combination with other embodiments unless otherwise specifically indicated.

FIG. 1 is a block diagram illustrating a configuration of a memory system 10 including a memory controller 20 and a dual in-line memory module (DIMM).

Referring to FIG. 1, the memory system 10 may also include a plurality of memory modules 30 to 60. Each of the memory modules 30 to 60 may be implemented with a DIMM, and inserted into a corresponding slot (not illustrated).

The memory controller 20 may output a command CMD, an address ADD and a clock signal CLK to the plurality of memory modules 30 to 60 through a predetermined transmission line. The command CMD may include a row address strobe (RAS) signal, a column address strobe (CAS) signal, a write enable (WE) signal, a chip select (CS) signal and the like. The CS signal may be provided to access a semiconductor device, rank or memory module. Furthermore, the memory controller 20 may receive data DQ read from the memory modules 30 to 60 through a predetermined transmission line during a read operation, and transmit data DQ and a data strobe signal DQS (not shown) to the memory modules 30 to 60 through the transmission line during a write operation.

Each of the memory modules 30 to 60 may include one or more ranks depending on its type. That is, each of the memory modules 30 to 60 may have a plurality of memory chips mounted on one surface or both surfaces thereof. When a plurality of memory chips are mounted on both surfaces of the memory module, it may indicate that the memory module includes two ranks. When a plurality of memory chips are mounted on one surface of the memory module, it may indicate that the memory module includes one rank. FIG. 1 illustrates the case in which each of the memory modules 30 to 60 includes two ranks. Referring to FIG. 1, a plurality of memory chips may be mounted on the front surfaces 30A to 60A and the rear surfaces 30B to 60B of the respective memory modules 30 to 60. The plurality of memory modules 30 to 60 may include a plurality of memory chips 31A to 61A and 31B to 61B and peripheral circuit units 33A to 63A and 338 to 638, respectively.

Hereafter, referring to FIG. 2, the configuration of the DIMM will be described briefly. Since the plurality of memory modules 30 to 60 have substantially the same configuration, the following descriptions will be focused on the components arranged on the front surface 30A of the memory module 30 among the plurality of memory modules 30 to 60.

Figure 2:
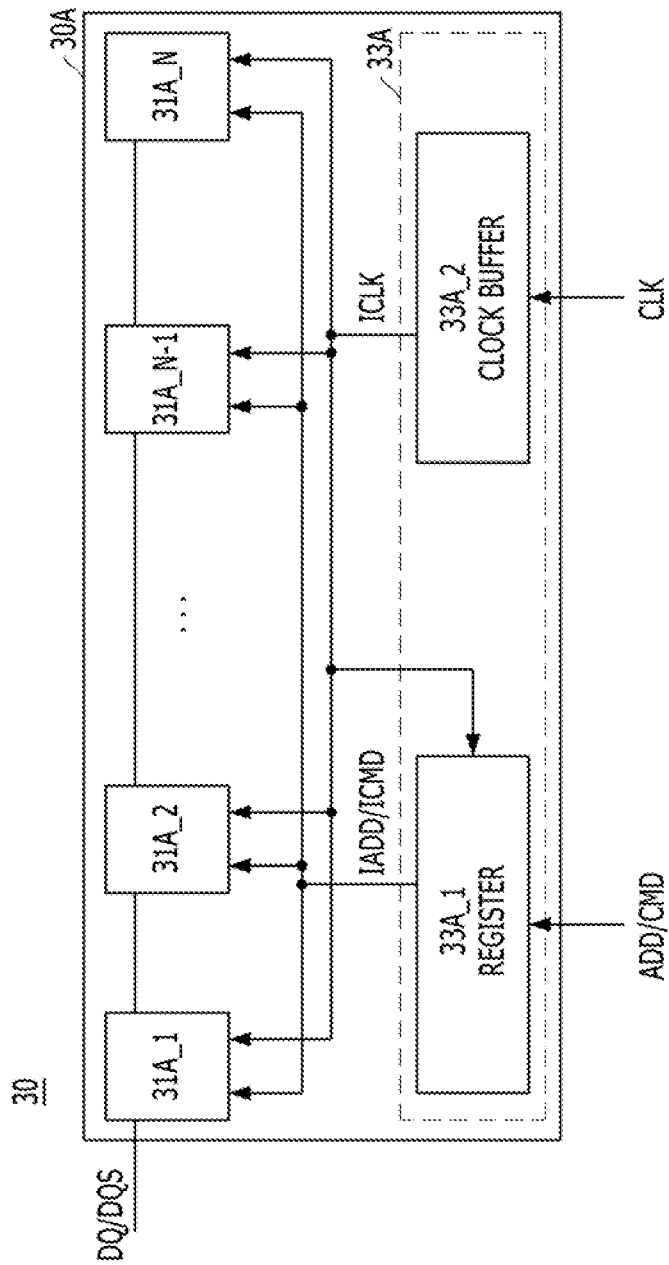
FIG. 2 is a block diagram illustrating a configuration of a memory module of FIG. 1.

FIG. 2 is a block diagram illustrating a configuration of the memory module 30 of FIG. 1.

Referring to FIG. 2, the memory module 30 may include a plurality of memory devices, for example, DRAM chips 31A_1 to 31A_N and a peripheral circuit unit 33A.

The peripheral circuit unit 33A may include a register 33A_1 and a clock buffer 33A_2.

The clock buffer 33A_2 may buffer a clock signal CLK, and output an internal clock signal ICLK. In an embodiment, the clock buffer 33A_2 may be implemented with a phase locked loop (PLL). In another embodiment, the clock buffer 33A_2 may be implemented with a delay locked loop (DLL). FIG. 2 illustrates that the clock buffer 33A_2 buffers the clock signal CLK and generate one internal clock signal ICLK. However, the present embodiment is not limited thereto. That is, depending on the clock signal CLK, various types of internal clock signals ICLKI may be generated.

The register 33A_1 may receive a command CMD and address ADD from the memory controller 20 of FIG. 1 through the predetermined transmission line, buffer the received command CMD and address ADD, and output an internal command ICMD and internal address IADD to the DRAM chips 31A_1 to 31A_N in response to the internal clock signal ICLK outputted from the clock buffer unit 33A_2.

Each of the DRAM chips 31A_1 to 31A_N may receive the internal clock signal ICLK, the internal command ICMD and the internal address IADD, and perform a read operation, a write operation, a refresh operation or a repair operation. Each of the DRAM chips 31A_1 to 31A_N may include a plurality of banks. Each of the banks may include a cell array, a row circuit and a column circuit. In this example, the DRAM chips 31A_1 to 31A_N mounted on one DIMM may be driven according to the same command CMD, clock signal CLK and address ADD.

Hereafter, referring to FIGS. 3A and 3B, repair operations of the DRAM chips will be described. For simple description, it is described as an example that the DRAM chips include a first DRAM chip CHIP_A and a second DRAM chip CHIP_B, and each of the first and second DRAM chips CHIP_A and CHIP_B includes four banks.

Figure 3A:
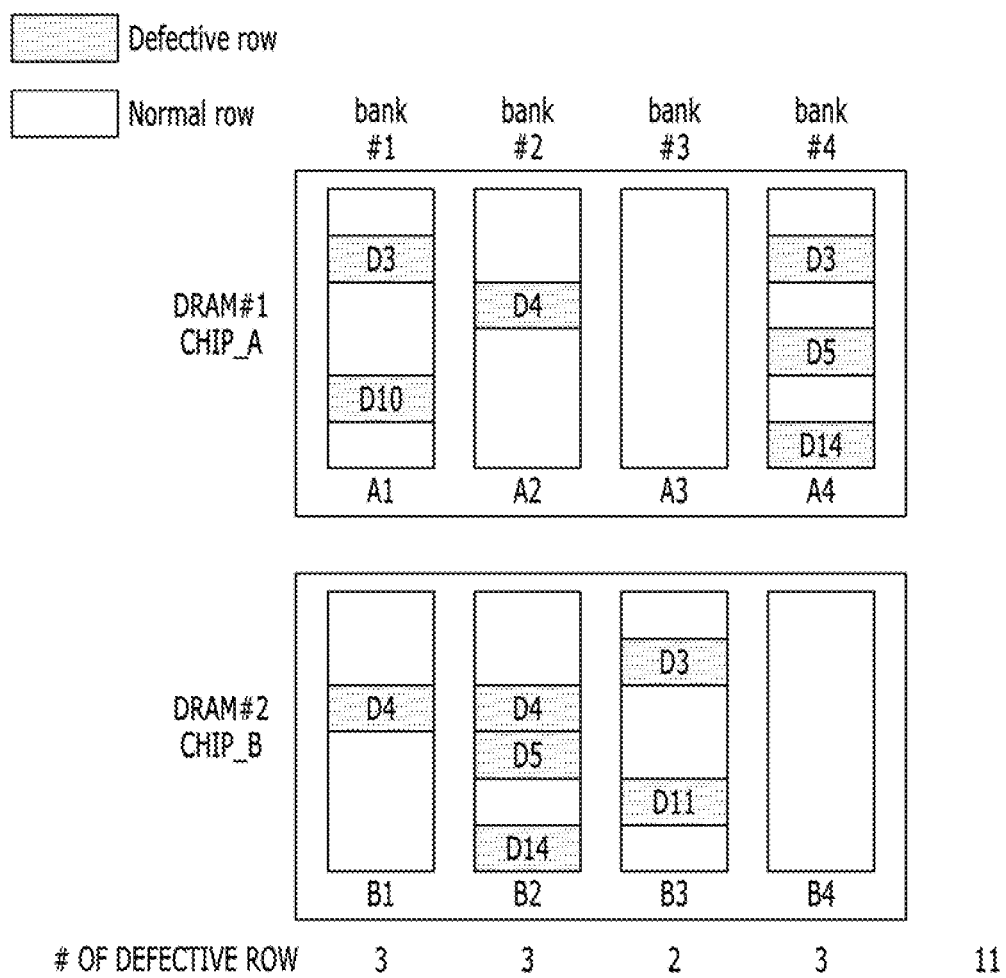
FIG. 3A is a diagram illustrating the number of defective rows in a conventional bank mapping method.

FIG. 3A illustrates the number of defective rows in a conventional bank mapping method. FIG. 3B illustrates the number of defective rows in a bank mapping method in an embodiment of the present invention. For reference, a defective row is a row where a defective cell is positioned. A defective cell may be a cell in which an error occurred or a weak cell in which an error is likely to occur.

Referring to FIG. 3A, the first DRAM chip CHIP_A may include defective cells positioned at third and tenth rows D3 and D10 of a first bank A1, a fourth row D4 of a second bank A2, and third, fifth and 14th rows D3, D5 and D14 of a fourth bank A4. Furthermore, the second DRAM chip CHIP_B may include defective cells positioned at a fourth row D4 of a first bank B1, fourth, fifth, and 14th rows D4, D5 and D14 of a second bank B2, and third and 11th rows D3 and Di of a third bank B3.

In this example, since the first and second DRAM chips CHIP_A and CHIP_B are mounted on one DIMM they are driven according to the same command CMD, clock signal CLK and address ADD, hence a row having a defective cell in either of the first and second DRAM chips CHIP_A and CHIP_B cannot be used in either of the first and second DRAM chips CHIP_A and CHIP_B.

Thus, in the conventional bank mapping method, a total of 11 rows cannot be used because the first banks A1 and B1 include three defective rows, the second banks A2 and B2 Include three defective rows, the third banks A3 and B3 include two defective rows, and the fourth banks A4 and B4 include three defective rows. That is, although the third bank A3 of the first DRAM chip CHIP_A has no defective cells, the third row D3 and the 11th row D11 of the third bank A3 cannot be used due to two defective rows existing in the third bank A3 of the second DRAM chip CHIP_B. Thus, the entire yield of the DIMM may be reduced.

In an embodiment of the present invention, the memory module including the plurality of memory chips which operate in response to the same command and address may map banks of the memory chips, which have the same address of defective rows or columns, based on repair information of the memory chips, thereby improving the entire yield of the memory module.

Figure 3B:
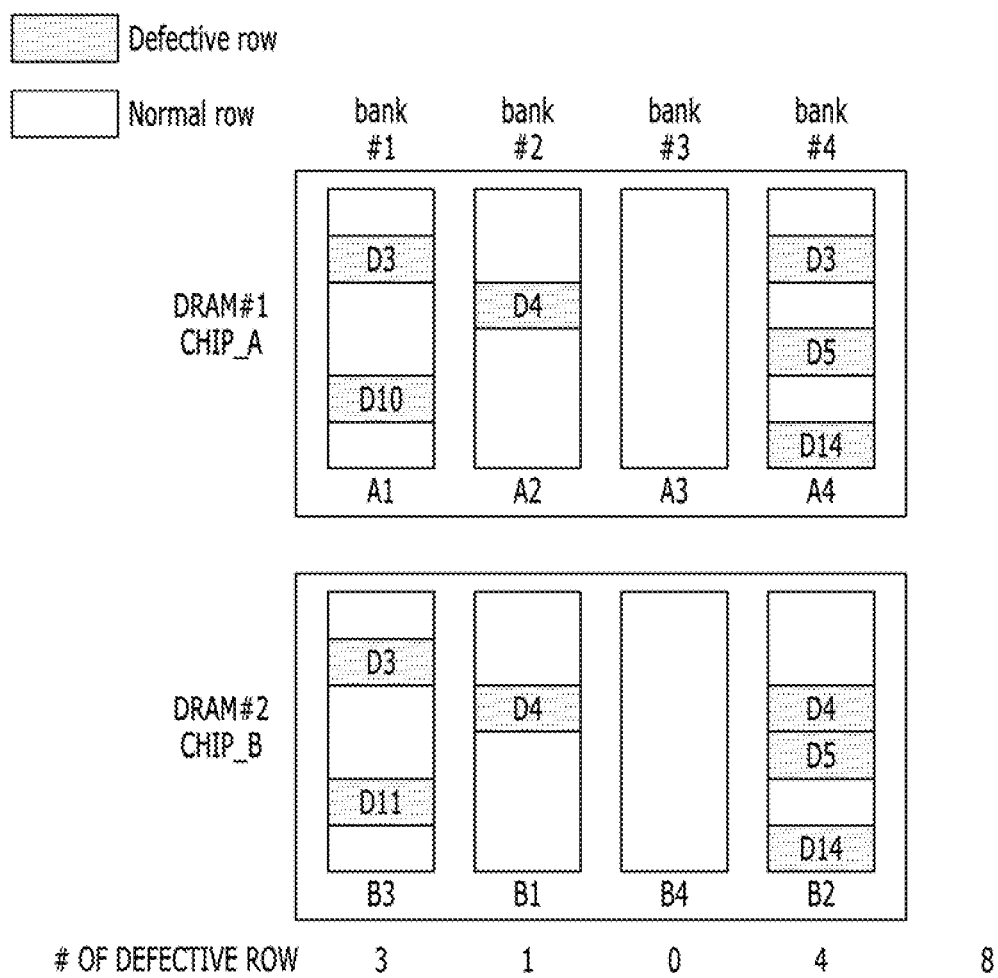
FIG. 3B is a diagram illustrating the number of defective rows in a bank mapping method, according to an embodiment of the present invention.

That is, referring to FIG. 3B, the banks of the second DRAM chip CHIP_B may be rearranged by the bank mapping method in an embodiment of the present invention. For example, the third bank A3 of the first DRAM chip CHIP_A and the fourth bank B4 of the second DRAM chip CHIP_B, which have no defective rows, may be mapped to each other, and the first bank A1, the second bank A2 and the fourth bank A4 of the first DRAM chip CHIP_A and the third bank B3, the first bank B1 and the second bank B2 of the second DRAM chip CHIP_B, which have the same defective rows, may be mapped to each other. That is, the third, first, fourth and second banks B3, B1, B4 and B2 of the second DRAM chip CHIP_B may be rearranged as first to fourth banks and mapped in the order named, corresponding to the first to fourth banks A1 to A4 of the first DRAM chip CHIP_A, respectively.

Thus, using the bank mapping method, according to an embodiment of the present invention, only a total of 8 rows cannot be used instead of 11 under the same condition, because the first banks A1 and B3 include three defective rows, and the second banks A2 and B1 include one defective row, and the third banks A3 and B4 include no defective rows, and the fourth banks A4 and B2 include fourth defective rows, after the bank mapping operation. Thus, while the number of defective rows in the conventional bank mapping method is 11, the number of defective rows in the bank mapping method according to an embodiment of the present invention is 8, which makes it possible to improve the entire yield of the memory module.

Figure 4:
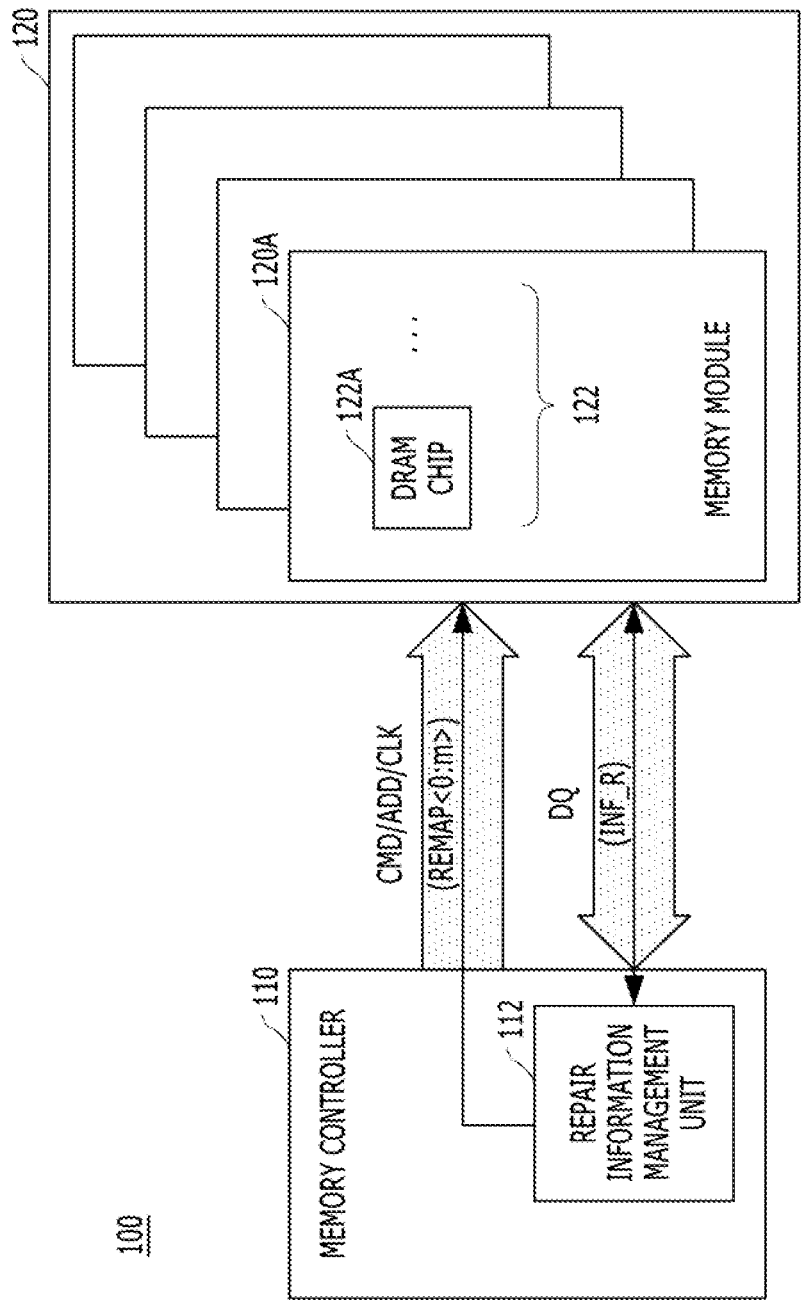
FIG. 4 is a block diagram illustrating a configuration of a memory system, according to an embodiment of the present invention.

Referring now to FIG. 4, a memory system including a memory module which performs the bank mapping method according to an embodiment of the present invention will be described. In order to focus on the configuration of the memory system in the embodiment of the present invention, the detailed descriptions of the configuration of the peripheral circuit unit included in each of the memory modules are omitted herein.

FIG. 4 is a block diagram illustrating a configuration of a memory system 100, according to an embodiment of the present invention.

According to the embodiment of FIG. 4, the memory system 100 may include a memory controller 110 and a plurality of memory modules 120. Each of the memory modules 120 may be implemented with a DIMM, and inserted into a corresponding slot (not illustrated).

The memory controller 110 may output a command CMD, an address ADD and a clock signal CLK to the plurality of memory modules 120 through a predetermined transmission line. Furthermore, the memory controller 110 may receive data DQ read from the plurality of memory modules 120 through a predetermined transmission line during a read operation, and transmit data DQ and a data strobe signal DQS to the plurality of memory modules 120 through the transmission line during a write operation.

Each of the memory modules 120 may include one or more ranks depending on its type. Each of the memory modules 120 may include a plurality of memory devices, for example, DRAM chips 122 mounted thereon.

Each of the DRAM chips 122 may include a memory core including a memory cell array and a repair storage unit storing a row or column address of a defective cell within the memory cell array, that is, a repair target address. The memory core and the repair storage unit are not illustrated. Typically, after a memory chip is designed and fabricated, a redundancy analysis operation is performed to determine whether the memory chip is defective through a test process at the wafer level thereof and a test process after packaging the memory chip. After the redundancy analysis operation, a row or column address of memory cells which are determined to be weak cells or defective cells may be stored as a repair target address in the repair storage unit.

The memory controller 110 may include a repair information management unit 112 which receives information on the repair target address stored after the redundancy analysis operation, that is, repair information INF_R from the DRAM chips 122, stores the received information, and generates a mapping signal REMAP<0:m> for mapping banks of which defective cells have the same address, based on the stored information. A reference numeral m may be determined depending on the number of banks included in each of the DRAM chips 122. For reference, the mapping signal REMAP<0:m> may be transmitted to the corresponding DRAM chips 122 during a per-DRAM addressability (PAD) mode. The PDA mode may indicate a mode in which an independent mode register set operation can be performed on each of the DRAM chips 122. Furthermore, the mapping signal REMAP<0:m> may be outputted in the form of an address ADD or command CMD from the memory controller 110 to the memory modules 120 through a predetermined transmission line, and the repair information INF_R may be transmitted in the form of data DQ from the respective memory modules 120 to the memory controller 110 through a predetermined transmission line.

In an embodiment, the repair information management unit 112 may include a storage unit (not illustrated) for storing the repair information INF_R of the DRAM chips 122, and the storage unit may be implemented with one of an e-fuse array circuit, a NAND flash memory, a NOR flash memory and a nonvolatile memory such as MRAM (magnetoresistive random access memory), STT-MRAM (spin transfer torque magnetoresistive random access memory), ReRAM (resistive random access memory) or PCRAM (phase change random access memory).

The DRAM chips 122 may rearrange the order of the banks in response to the mapping signal REMAP<0:m> transmitted from the memory controller 110 during the PAD mode.

As described above, when the memory system in an embodiment of the present invention maps the banks of the plurality of memory chips which operate in response to the same command and address, the memory system may map banks of which defective cells have the same address, based on the repair information of the memory chips, thereby improving the entire yield of the memory module including the memory chips.

Figure 5:
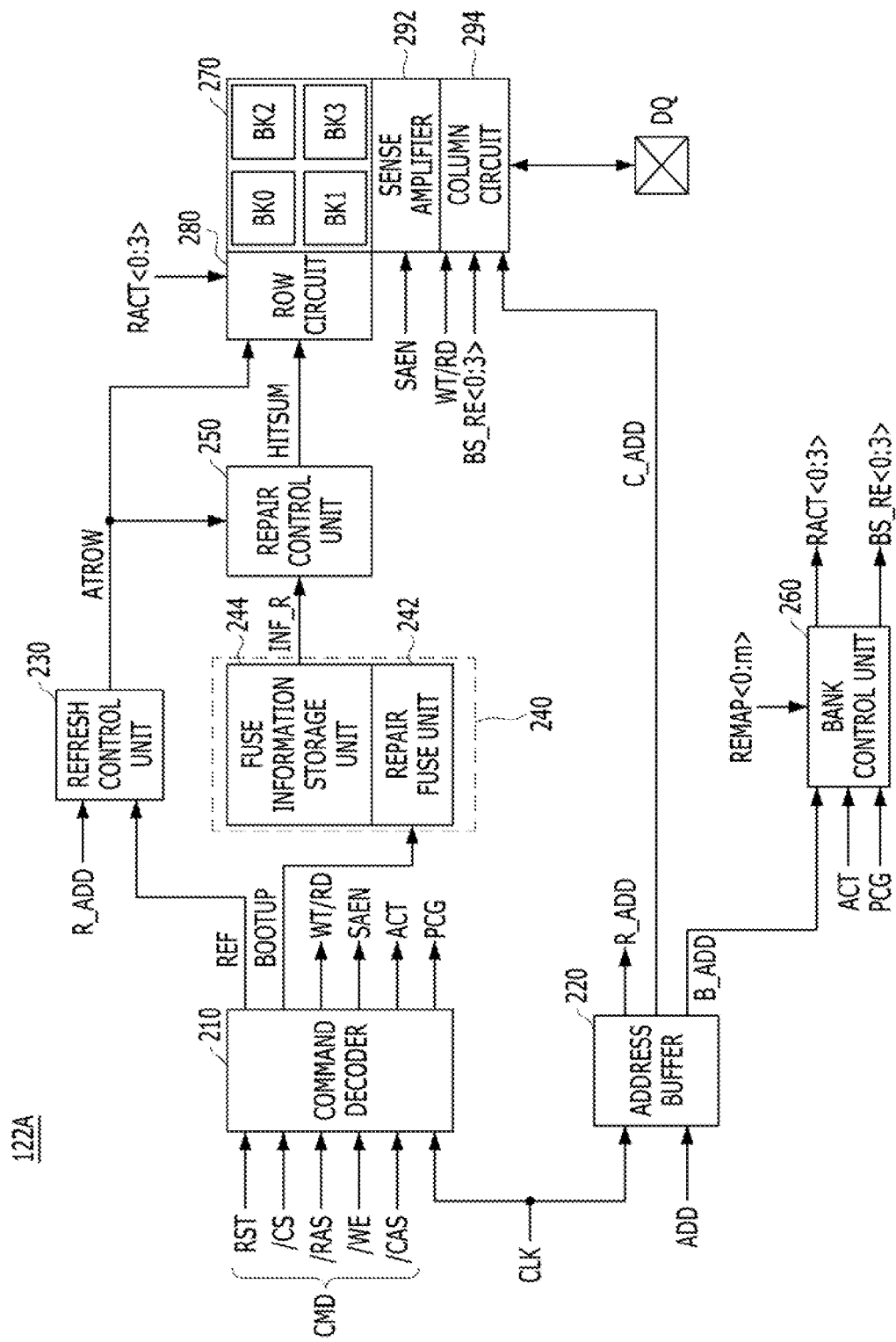
FIG. 5 is a block diagram illustrating a configuration of a DRAM chip of FIG. 4, according to an embodiment of the present invention.

Referring now to FIG. 5 a configuration of the DRAM chip 122A of FIG. 4 will be described, according to an embodiment of the present invention. Since the plurality of DRAM chips 122 have substantially the same configuration, only the DRAM chip 122A will be taken as an example.

According to FIG. 5, the DRAM chip 122A may include a command decoder 210, an address buffer 220, a refresh control unit 230, a repair storage unit 240, a repair control unit 250, a bank control unit 260, a memory array region 270, a row circuit 280, a sense amplifier 292 and a column circuit 294.

The command decoder 210 may decode a command CMD inputted from outside in response to the clock signal CLK, and generate a refresh signal REF, a boot-up signal BOOTUP, a write/read signal WT/RD, an active signal ACT, a precharge signal PCG and a sense amplifier control signal SAEN. At this time, the command CMD may include a reset signal RST, a row address strobe signal /RAS, a column address strobe signal /CAS, a write enable signal /WE and a chip select signal /CS.

The address buffer 220 may buffer an address ADD inputted from an external device in response to the clock signal CLK, and output a bank address B_ADD, a row address R_ADD and a column address C_ADD to the bank control unit 260, the column circuit 294 and the refresh control unit 230, respectively. At this time, the bit number of each address may be changed depending on the number of banks, the number of rows and the number of columns. For example, when the memory array region 270 includes four banks, the bank address B_ADD may have two bits.

The memory array region 270 may include a plurality of banks BK0 to BK3. Each of the banks may include a normal cell region (not Illustrated) and a redundancy cell region (not illustrated). When a defective cell or a repair target memory cell is found in the normal cell region, a normal word line where the repair target memory cell is positioned may be replaced with a redundancy word line of the redundancy cell region. For reference, the banks BK0 to BK3 of the memory module 122A may be mapped to banks of another memory module, respectively, and accessed by the same command CMD and address ADD.

The refresh control unit 230 may select a row address R_ADD or a refresh address REF_ADD generated by counting the refresh signal REF received from the command decoder 210, and output the selected address as a target row address ATROW to the row circuit 280. During a refresh operation, the refresh control unit 230 may output the refresh address REF_ADD as the target row address ATROW and the row circuit 280 may receive the target row address ATROW, and sequentially access the word lines of the banks BK0 to BK3 within the memory array region 270, to perform the refresh operation.

The repair storage unit 240 may store a row address corresponding to a defective cell within the memory array region 270 as a repair target address, and output the repair target address as the repair information INF_R to the repair control unit 250. More specifically, the repair storage unit 240 may include a repair fuse unit 242 and a fuse information storage unit 244. The repair fuse unit 242 may include a plurality of fuses (not illustrated) for programming a repair target address. The repair fuse unit 242 may output a programmed repair target address to the fuse information storage unit 244 in response to the boot-up signal BOOTUP received from the command decoder. The fuse information storage unit 244 may store the repair target address provided from the repair fuse unit 242 as the repair information INF_R, and output the repair information INF_R to the repair control unit 250.

The repair control unit 250 may compare the repair information INF_R provided from the fuse information storage unit 244 to the target row address ATROW received from the refresh control unit 230, and output a repair control signal HITSUM to the row circuit 280. When the repair information INF_R and the target row address ATROW coincide with each other, the repair control unit 250 may activate and output the repair control signal HITSUM.

The bank control unit 260 may generate a plurality of bank select signals BS_RE by decoding the bank address B_ADD, and rearrange the order of the bank select signals SB_RE in response to the mapping signal REMAP<0:m>. For reference, the mapping signal REMAP<0:m> may be transmitted in the form of an address ADD or command CMD from the memory controller 110 of FIG. 4 to the DRAM chip 122A through the predetermined transmission line, during the PAD mode.

The bank control unit 260 may generate a plurality of bank enable signals RACT using the plurality of bank select signals BS_RE, in response to an active signal ACT and a precharge signal PCG. At this time, the bank select signal BS_RE may correspond to one of the banks BK0 to BK3 and indicate that the corresponding bank is selected. The bank enable signal RACT may correspond to one of the banks BK0 to Bk3 and indicate that an active command to activate the corresponding bank is enabled. For example, when the memory array region 270 includes four banks BK0 to BK3, the bank address B_ADD may be set to a 2-bit bank address B_ADD<0:1>, and the bank control unit 260 may generate four bank select signals BS_RE<0:3> and four bank enable signals RACT<0:3> corresponding to the respective banks BK0 to BK3.

In an embodiment, the bank control unit 260 may generate a pre-bank select signal BS by decoding the bank address B_ADD received from the address buffer 220. At this time, the bank control unit 260 may generate the bank select signal BS_RE by rearranging the pre-bank select signal BS in response to the mapping signal REMAP<0:m>. In another embodiment (not shown), the bank control unit 260 may generate a rearranged bank address B_RE_ADD by rearranging the bank address B_ADD in response to the mapping signal REMAP<0:m>, and generate the bank select signal BS_RE by decoding the rearranged bank address B_RE_ADD.

The row circuit 280 may enable a word line selected by the target row address ATROW in response to the bank enable signals RACT<0:3>. When the repair control signal HITSUM is activated, the row circuit 280 may enable a redundancy word line instead of a word line designated by the target row address ATROW. Thus, a repair target word line corresponding to the repair information INF_R stored in the fuse information storage unit 244 may be replaced with a redundancy word line.

The sense amplifier 292 may sense and amplify data of a memory cell, transmitted through a bit line from the memory array region 270, in response to the sense amplifier control signal SAEN.

The column circuit 294 may select a bank corresponding to an activated one among the plurality of bank select signals BS_RE0 to BS_RE3, and access data of bit lines selected by a column address C_ADD within the selected bank. For example, during a read operation, the column circuit 294 may output data received from a bit line selected by the column address C_ADD to a DQ pad, in response to a read signal RD. Furthermore, during a write operation, the column circuit 294 may transmit data inputted through the DQ pad to the bit line corresponding to the column address C_ADD in response to a write signal WT.

The DRAM chip 122A having the above-described configuration may generate the plurality of bank select signals SB_RE by decoding the bank address B_ADD, and rearrange the order of the bank select signals BS_RE in response to the mapping signal REMAP<0:m> transmitted from the memory controller 110 of FIG. 4. At this time, the mapping signal REMAP<0:m> may include information capable of mapping banks of the DRAM chips 122 of FIG. 4, which have the same address of defective cells, based on the repair information of the DRAM chips 122 of FIG. 4. Thus, the entire yield of the memory module 120A of FIG. 4 may be improved.

Figure 6A:
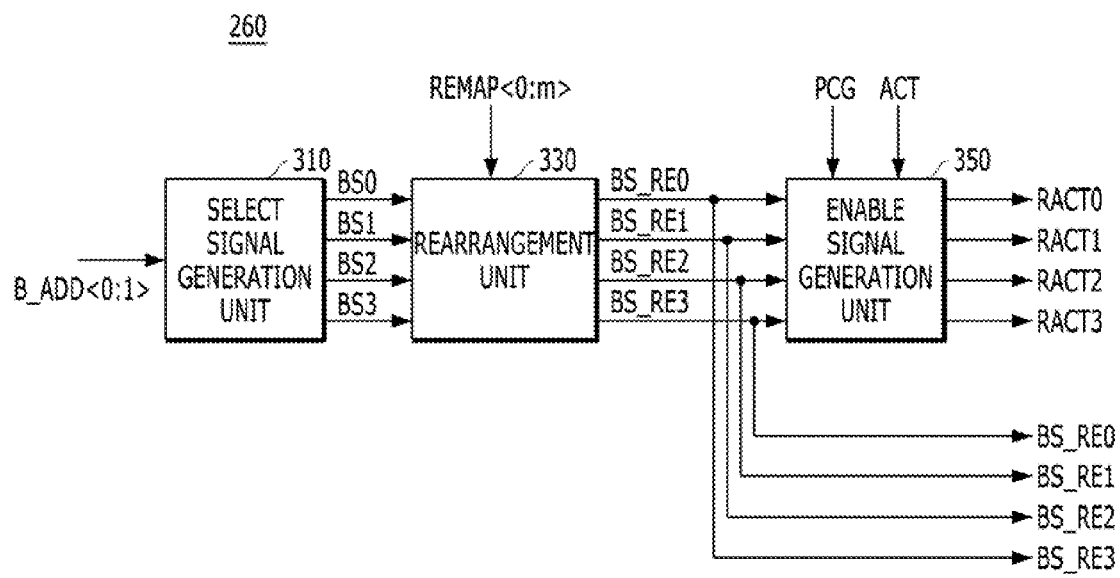
FIG. 6A is a block diagram illustrating a configuration of a bank control unit of FIG. 5, according to an embodiment of the present invention.
Figure 6B:
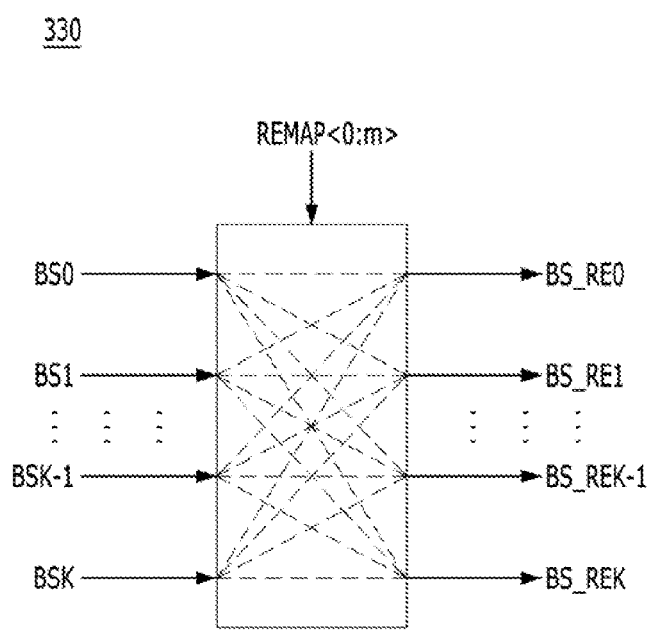
FIG. 6B is a diagram illustrating an operation of a rearrangement unit of FIG. 6A, according to an embodiment of the present invention.

FIG. 6A is a block diagram illustrating a configuration of the bank control unit 260 of FIG. 5, according to an embodiment of the present invention. FIG. 6B is a diagram for illustrating an operation of a rearrangement unit 330 of FIG. 6A, according to an embodiment of the present invention.

Referring to FIG. 6A, the bank control unit 260 may include a select signal generation unit 310, a rearrangement unit 330 and an enable signal generation unit 350.

The select signal generation unit 310 may generate a plurality of pre-bank select signals BS0 to BS3 corresponding to the respective banks BK0 to BK3 by decoding the bank address B_ADD<0:1>. The select signal generation unit 310 may activate a pre-bank select signal selected by the bank address B_ADD<0:1>, and deactivate the other pre-bank select signals. For example, when the bank BK2 is selected, the select signal generation unit 310 may activate the pre-bank select signal BS2 to a high level, and deactivate the other pre-bank select signals BS0, BS1 and BS3 to a low level.

The rearrangement unit 330 may generate a plurality of bank select signals BS_RE0 to BS_RE3 by rearranging the order of the pre-bank select signals BS0 to BS3 in response to the mapping signal REMAP<0:m>.

As illustrated in FIG. 6B, the rearrangement unit 330 may match the pre-bank select signals BS0 to BS3 with the bank select signals BS_RE0 to BS_RE3 one to one in response to the mapping signal REMAP<0:m>, and thus rearrange the order of the banks BK0 to BK3 within the memory array region 270 as illustrated in FIG. 3B.

The enable signal generation unit 350 may generate a plurality of bank enable signals RACT0 to RACT3 for enabling the banks BK0 to BK3 corresponding to the bank select signals BS_RE0 to BS_RE3, in response to the active signal ACT and the precharge signal PCG. The enable signal generation unit 350 may activate a bank enable signal corresponding to an activated bank select signal among the bank select signals BS_RE0 to BS_RE3 when the active signal ACT is activated, and deactivate a bank enable signal corresponding to an activated bank select signal among the bank select signals BS_RE0 to BS_RE3 when the precharge signal PCG is activated. For example, the enable signal generation unit 350 may activate the bank enable signal RACT2 when the bank select signal BS_RE2 and the active signal ACT are activated, and then deactivate the activated bank enable signal RACT2 when the bank select signal BS_RE2 and the precharge signal PCG are activated. Once the bank enable signals RACT0 to RACT3 are activated, the bank enable signals RACT0 to RACT3 may maintain the active state until the bank enable signal RACT0 to RACT3 are deactivated by the precharge signal PCG. Thus, the plurality of bank enable signals RACT0 to RACT3 may be activated to overlap each other. That is, the plurality of banks BK0 to BK3 may be activated at the same time.

FIG. 6A illustrates the case in which the bank select signals BS are rearranged. In another embodiment, however, the bank select signals may be generated after the bank address B_ADD is rearranged.

Figure 7:
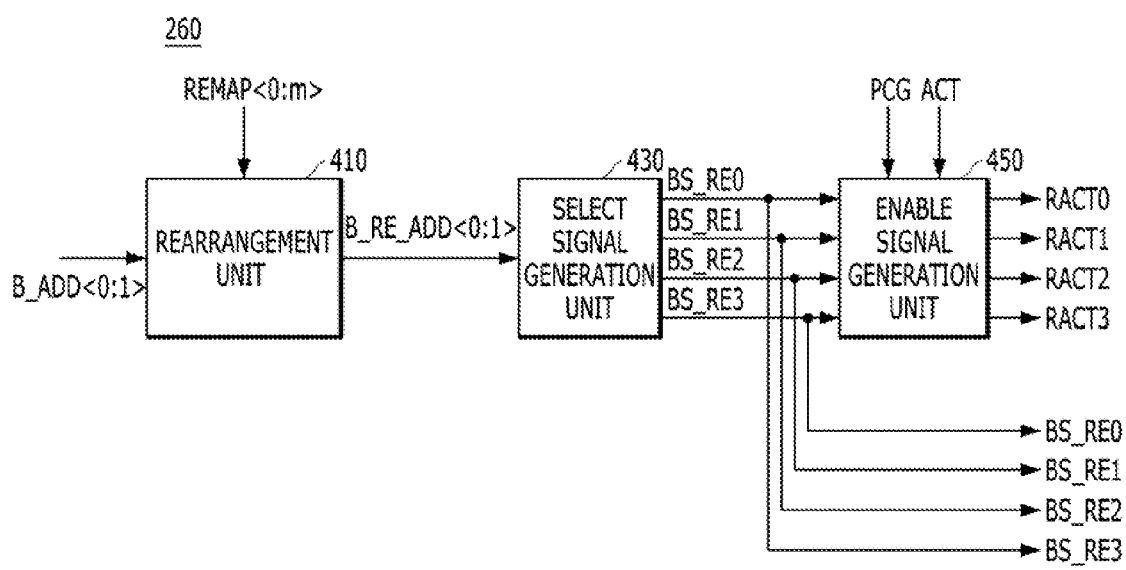
FIG. 7 is a block diagram illustrating a configuration of a bank control unit of FIG. 5, according to another embodiment of the present invention.

FIG. 7 is a block diagram illustrating a configuration of the bank control unit 260 of FIG. 5, according to another embodiment of the present invention.

Referring to FIG. 7, the bank control unit 260 may include a rearrangement unit 410, a select signal generation unit 430 and an enable signal generation unit 450.

The rearrangement unit 410 may generate a rearranged bank address B_RE_ADD by rearranging a bank address B_ADD in response to the mapping signal REMAP<0:m>.

The select signal generation unit 310 may decode the rearranged bank address B_RE_ADD and generate a plurality of bank select signals BS_RE0 to BS_RE3 corresponding to the respective banks BK0 to BK3. The enable signal generation unit 450 may generate a plurality of bank enable signals RACT0 to RACT3 for enabling the banks BK0 to Bk3 corresponding to the bank select signals BS_RE0 to BS_RE3, in response to the active signal ACT and the precharge signal PCG.

Hereafter, the operation of the memory system according to an embodiment of the present invention will be described with reference to the flowcharts of FIGS. 8A and 8B.

Figure 8A:
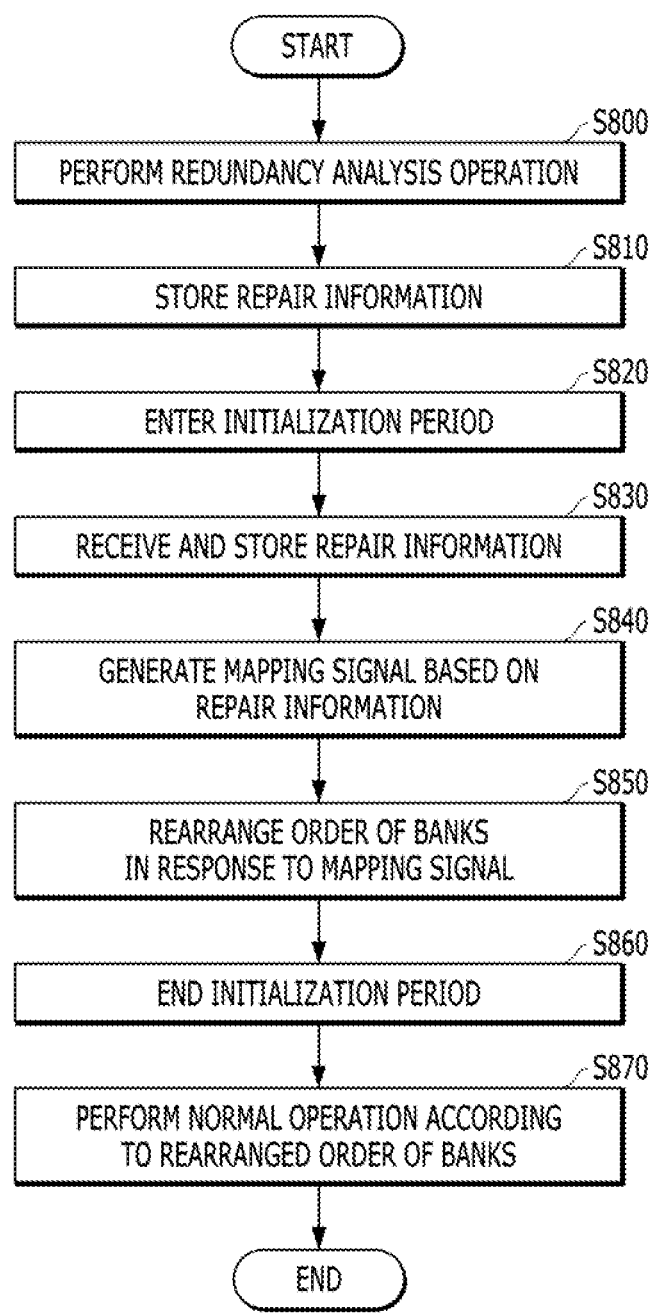
FIGS. 8A and 8B are flowcharts of an operation of a memory system, according to an embodiment of the present invention.
Figure 8B:
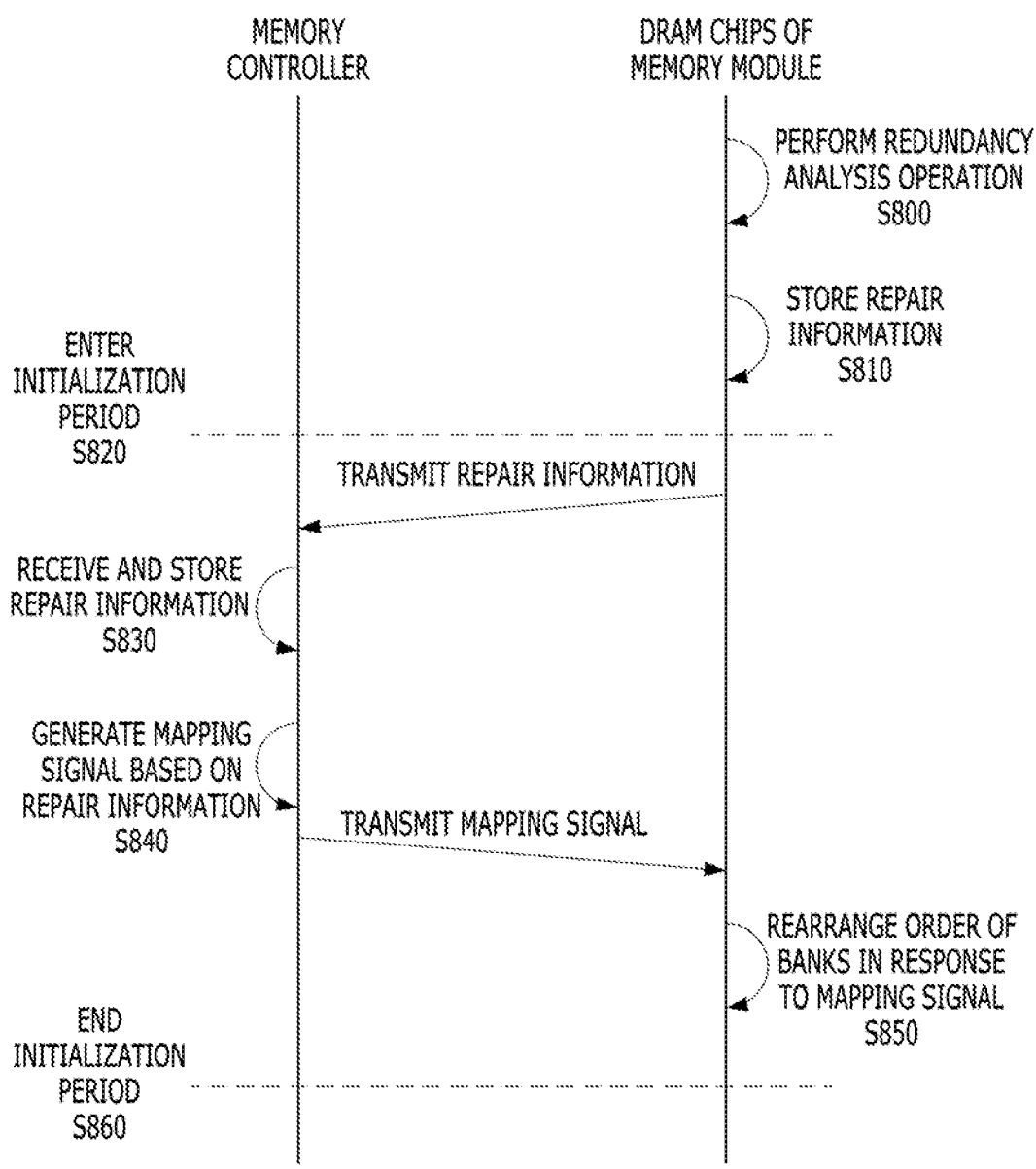

Referring to FIGS. 8A and 8B, the plurality of DRAM chips may perform a redundancy analysis operation to determine whether a defective chip exists, through a test process at the wafer level thereof and a test process after packaging the DRAM chips, at step S800. After the redundancy analysis operation, each of the DRAM chips may store a row or column address of memory cells, which are determined to be weak cells or defective cells, as repair information in the repair storage unit, at step S810.

When the DRAM chips are mounted on the memory module and the memory module is inserted into a corresponding slot (not illustrated) so as to configure the memory system, the memory system may enter an initialization period for setting initial parameters, at step S820. During the initialization period, the memory controller may receive and store information on repair target addresses stored in the respective DRAM chips of the memory module, that is, the repair information INF_R at step S830, and generate a mapping signal REMAP for mapping banks of which defective cells have the same address, based on the repair information INF_R, at step S840. Then, the memory controller may transmit the generated mapping signal REMAP in the form of an address ADD or command CMD to the DRAM chips through the predetermined transmission line, during the PAD mode.

The DRAM chips may rearrange the order of the banks in response to the mapping signal REMAP transmitted from the memory controller, at step S850. As described with reference to FIGS. 5 to 7, rearranging the order of the banks may include generating the plurality of bank select signals BS_RE by decoding the bank address B_ADD, and rearranging the order of the bank select signals BS_RE in response to the mapping signal REMAP<0:m> transmitted form the memory controller. Then, the initialization period may be ended at step S860, and a normal operation, for example, at least one of a read operation, write operation, refresh operation or repair operations may be performed according to the rearranged order of the banks.

As described above, according to an embodiment of the present invention, a memory system is provided which when it maps the banks of the plurality of memory chips which operate in response to the same command and address, may map banks of which defective cells have the same address, based on the repair information of the memory chips, thereby improving the entire yield of the memory module including the memory chips.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
a memory module comprising a plurality of memory chips mounted therein each memory chip comprising a plurality of banks, the memory chips being simultaneously accessible based on the same command and address; and
a memory controller suitable for mapping the banks of the memory chips to each other while rearranging an order of the banks of each of the memory chips based on repair information of the memory chips.

2. The memory system of claim 1, wherein the memory controller maps banks of which defective cells have the same row or column address, when mapping the banks of the memory chips to each other.

3. The memory system of claim 1, wherein the memory controller comprises:
a repair information management unit suitable for receiving and storing the repair information of the memory chips, and generating a mapping signal for mapping banks of which defective cells have the same row or column address, based on the stored repair information, during an initialization period.

4. The memory system of claim 3, wherein the repair information management unit comprises an e-fuse array or a nonvolatile memory device for receiving and storing the repair information of the memory chips.

5. The memory system of claim 3, wherein the memory controller transmits the mapping signal in the form of an address or command to the memory chips, during a per-dynamic random access memory (DRAM) addressability (PAD) mode.

6. The memory system of claim 3, wherein each of the memory chips comprises:
a memory array region having the plurality of banks arranged therein, the plurality of banks each comprising normal cells and redundancy cells for replacing repair target cells among the normal cells;
a repair storage unit suitable for storing repair addresses of the repair target cells, and outputting the repair addresses as the repair information;
a repair control unit suitable for comparing the repair information and a row address, and generating a repair control signal for selectively enabling redundant paths between the repair target cells and the redundancy cells;
a bank control unit suitable for generating a plurality of bank select signals by decoding a bank address, generating a plurality of bank enable signals based on the bank select signals, and rearranging the order of the bank select signals in response to the mapping signal;
a row circuit suitable for enabling a word line corresponding to the row address based on the bank select signals and the repair control signal; and
a column circuit suitable for accessing data of a bit line selected by the bank enable signals and a column address during a read or write operation.

7. The memory system of claim 6, wherein the bank control unit comprises:
a select signal generation unit suitable for generating pre-bank select signals corresponding to the respective banks by decoding the bank address;
a rearrangement unit suitable for generating the bank select signals by rearranging the order of the pre-bank select signals in response to the mapping signal; and
an enable signal generation unit suitable for generating the bank enable signals for enabling the respective banks corresponding to the bank select signals in response to an active signal and a precharge signal.

8. The memory system of claim 6, wherein the bank control unit comprises:

a rearrangement unit suitable for generating a rearranged bank address by rearranging the bank address in response to the mapping signal;

a select signal generation unit suitable for generating the bank select signals by decoding the rearranged bank address; and an enable signal generation unit suitable for generating the bank enable signals for enabling the respective banks corresponding to the bank select signals in response to an active signal and a precharge signal.

9. A memory module comprising:

a plurality of memory chips suitable for being simultaneously accessed based on the same command and address and each comprising a plurality of banks mapped to respective banks of the other memory chips, wherein each of the memory chips comprises:

a memory array region having the plurality of banks arranged therein, the plurality of banks each including normal cells and redundancy cells for replacing repair target cells among the normal cells;

a repair storage unit suitable for storing repair addresses of the repair target cells, and outputting the repair addresses as repair information;

a repair control unit suitable for comparing the repair information and a row address, and generating a repair control signal for selectively enabling redundant paths between the repair target cells and the redundancy cells;

a bank control unit suitable for generating a plurality of bank select signals by decoding a bank address, generating a plurality of bank enable signals based on the bank select signals, and rearranging the order of the bank select signals in response to a mapping signal;

a row circuit suitable for enabling a word line corresponding to the row address based on the bank select signals and the repair control signal; and a column circuit suitable for accessing data of a bit line selected by the bank enable signals and a column address during a read or write operation.

10. The memory module of claim 9, wherein the mapping signal comprises information for mapping banks of which defective cells have the same row or column address, based on the repair information.

11. The memory module of claim 9, wherein the mapping signal is transmitted in the form of an address or command from a memory controller to the memory chips during a per-dynamic random access memory (DRAM) addressability (PAD) mode.

12. The memory module of claim 9, wherein the bank control unit comprises:

a select signal generation unit suitable for generating pre-bank select signals corresponding to the respective banks by decoding the bank address;

a rearrangement unit suitable for generating the bank select signals by rearranging the order of the pre-bank select signals in response to the mapping signal; and an enable signal generation unit suitable for generating the bank enable signals for enabling the respective banks corresponding to the bank select signals in response to an active signal and a precharge signal.

13. The memory module of claim 9, wherein the bank control unit comprises:

a rearrangement unit suitable for generating a rearranged bank address by rearranging the bank address in response to the mapping signal;

a select signal generation unit suitable for generating the bank select signals by decoding the rearranged bank address; and an enable signal generation unit suitable for generating the bank enable signals for enabling the respective banks corresponding to the bank select signals in response to an active signal and a precharge signal.

14. The memory module of claim 9, wherein the repair storage unit comprises:

a repair fuse unit comprising a plurality of fuse sets for programming the repair addresses of the repair target cells, and suitable for outputting the repair addresses programmed in the plurality of fuse sets in response to a boot-up signal; and a fuse information storage unit suitable for storing the repair addresses provided from the repair fuse unit as the repair information.

15. The memory module of claim 9, further comprising:

a clock buffer unit suitable for buffering a clock signal inputted from an outside and outputting one or more internal clock signals; and a register suitable for buffering a command and address inputted from the outside, and providing an internal command and address to the memory chips in response to the internal clock signal.

16. An operation method of a memory system which includes a memory controller and a memory module having a plurality of memory chips each including a plurality of banks, the operation method comprising:

storing, by the memory chips, a row or column address of memory cells as repair information, the memory cells being determined to be weak cells or defective cells;

generating, by the memory controller, a mapping signal based on the repair information stored in the memory chips of the memory module during an initialization period;

rearranging, by the memory chips, the order of the banks based on the mapping signal; and simultaneously accessing the respective banks of the memory chips in the rearranged order based on the same command and address after the initialization period.

17. The operation method of claim 16, wherein the respective banks of the memory chips in the rearranged order have the same row or column address of defective cells.

18. The operation method of claim 16, wherein the rearranging of the order of the banks in response to the mapping signal comprises:

generating a plurality of bank select signals by decoding a bank address, and rearranging the order of the bank select signals in response to the mapping signal; and generating bank enable signals for enabling the respective banks corresponding to the bank select signals in response to an active signal and a precharge signal.

19. The operation method of claim 18, wherein the generating and rearranging of the bank select signals comprises:

generating pre-bank select signals corresponding the respective banks by decoding the bank address; and generating the bank select signals by rearranging the order of the pre-bank select signals in response to the mapping signal.

20. The operation method of claim 18, wherein the generating and rearranging of the bank select signals comprises:

generating a rearranged bank address by rearranging the bank address in response to the mapping signal; and generating the bank select signals by decoding the rearranged bank address.

* * * * *